US012560986B2

(12) United States Patent
Tang et al.

(10) Patent No.: US 12,560,986 B2
(45) Date of Patent: Feb. 24, 2026

(54) CHASSIS-BASED STORAGE DEVICE WITH DUAL-END SLIDING FRAME

(71) Applicant: Huawei Technologies Co., Ltd., Shenzhen (CN)

(72) Inventors: Yinzhong Tang, Dongguan (CN); Ming Chen, Chengdu (CN); Can Chen, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 395 days.

(21) Appl. No.: 17/866,015

(22) Filed: Jul. 15, 2022

(65) Prior Publication Data

US 2022/0350377 A1 Nov. 3, 2022

Related U.S. Application Data

(63) Continuation of application No. PCT/CN2020/141810, filed on Dec. 30, 2020.

(30) Foreign Application Priority Data

Jan. 16, 2020 (CN) .......................... 202010044656.9
Feb. 10, 2020 (CN) .......................... 202010085276.X

(51) Int. Cl.
| | |
|---|---|
| *G06F 1/20* | (2006.01) |
| *G06F 1/18* | (2006.01) |
| *G06F 1/187* | (2026.01) |
| *H05K 7/20* | (2006.01) |

(52) U.S. Cl.
CPC ................ *G06F 1/187* (2013.01); *G06F 1/20* (2013.01); *H05K 7/20136* (2013.01)

(58) Field of Classification Search
CPC ............ G06F 1/187; G06F 1/20; G06F 1/183; H05K 7/20136; H05K 7/20727; H05K 7/1489
See application file for complete search history.

(56) References Cited

U.S. PATENT DOCUMENTS

| | | | | |
|---|---|---|---|---|
| 6,621,692 B1 * | 9/2003 | Johnson | ............... | H05K 7/1421 |
| | | | | 361/679.55 |
| 7,092,249 B2 * | 8/2006 | Wang | ...................... | G06F 1/181 |
| | | | | 361/679.33 |
| 7,440,273 B2 * | 10/2008 | Chen | .................... | G11B 33/123 |
| | | | | 361/679.33 |

(Continued)

FOREIGN PATENT DOCUMENTS

| | | |
|---|---|---|
| CN | 101741045 A | 6/2010 |
| CN | 207166014 U | 3/2018 |

(Continued)

*Primary Examiner* — Rockshana D Chowdhury
(74) *Attorney, Agent, or Firm* — Conley Rose, P.C.

(57) ABSTRACT

A chassis includes a chassis body and an installation frame, and the chassis body has a channel that passes through a first end and a second end that are of the chassis body. The installation frame is slidably disposed in the channel of the chassis body. The installation frame has a first part facing the first end of the chassis body and a second part facing the second end of the chassis body; and the first part is capable of sliding out from the first end of the chassis body, and the second part is capable of sliding out from the second end of the chassis body.

20 Claims, 6 Drawing Sheets

(56)                References Cited

U.S. PATENT DOCUMENTS

| | | | | |
|---|---|---|---|---|
| 7,460,365 | B2 * | 12/2008 | Morris | G06F 1/187 |
| | | | | 361/679.33 |
| 8,045,343 | B2 * | 10/2011 | Fan | H05K 7/1491 |
| | | | | 361/825 |
| 8,184,442 | B2 * | 5/2012 | Fujimura | H05K 7/1418 |
| | | | | 361/759 |
| 8,335,076 | B2 * | 12/2012 | Zhang | G06F 1/184 |
| | | | | 174/559 |
| 8,934,260 | B2 * | 1/2015 | Tanaka | H05K 9/0062 |
| | | | | 361/740 |
| 10,133,302 | B2 * | 11/2018 | Yuan | G06F 1/182 |
| 10,165,703 | B1 * | 12/2018 | Adrian | H05K 7/1491 |
| 11,991,852 | B2 * | 5/2024 | Shih | H05K 7/1487 |
| 2008/0036347 | A1 * | 2/2008 | Liang | A47B 88/40 |
| | | | | 312/334.5 |
| 2010/0123377 | A1 | 5/2010 | Hsu | |
| 2010/0124473 | A1 | 5/2010 | Hoshino et al. | |
| 2011/0176271 | A1 * | 7/2011 | Zhang | G11B 33/128 |
| | | | | 361/679.33 |
| 2013/0155599 | A1 * | 6/2013 | Ross | H05K 7/1487 |
| | | | | 361/679.02 |
| 2014/0204537 | A1 | 7/2014 | Rust | |
| 2014/0265793 | A1 | 9/2014 | Evans et al. | |
| 2015/0103492 | A1 * | 4/2015 | Wu | H05K 7/1431 |
| | | | | 361/726 |

FOREIGN PATENT DOCUMENTS

| | | | |
|---|---|---|---|
| CN | 208444242 | U | 1/2019 |
| CN | 208971031 | U | 6/2019 |
| CN | 209086895 | U | 7/2019 |
| CN | 209088309 | U | 7/2019 |
| JP | 2001144470 | A | 5/2001 |
| JP | 2010123795 | A | 6/2010 |
| JP | 2015225499 | A | 12/2015 |
| JP | 2016511500 | A | 4/2016 |
| JP | 2016153977 | A | 8/2016 |

* cited by examiner

CHASSIS-BASED STORAGE DEVICE WITH DUAL-END SLIDING FRAME

CROSS-REFERENCE TO RELATED APPLICATIONS

This is a continuation of International Patent Application No. PCT/CN2020/141810 filed on Dec. 30, 2020, which claims priority to Chinese Patent Application No. 202010044656.9 filed on Jan. 16, 2020 and Chinese Patent Application No. 202010085276.X filed on Feb. 10, 2020. All of the aforementioned patent applications are hereby incorporated by reference in their entireties.

TECHNICAL FIELD

This disclosure relates to the field of storage device technologies, and in particular, to a chassis and a storage device.

BACKGROUND

As data grows in amount, a user has a higher requirement for a storage capability of a storage device. In the storage device, a storage capacity is a key factor that affects the storage capability of the storage device. Simply speaking, a chassis of a conventional storage device includes a chassis body and hard disks installed in the chassis body. A capacity of a single hard disk and a quantity of hard disks determine the storage capacity of the storage device. With an increase in the quantity of hard disks, the industry also has a higher requirement for how to improve a design of the chassis.

SUMMARY

This disclosure provides a chassis and a storage device that have relatively proper layouts.

According to a first aspect, this disclosure provides a chassis, configured to accommodate, support, or fasten electronic components. Further, the chassis may include a chassis body and an installation frame located in the chassis body. An electronic component may be fastened on the installation frame. When the installation frame is located in the chassis body, the chassis body can provide a protection function or a confined space for the installation frame and the electronic component fastened on the installation frame. For ease of maintenance, in the chassis provided in this disclosure, the chassis body has a channel that passes through a first end and a second end that are of the chassis body, and the installation frame is slidably disposed in the channel of the chassis body. The installation frame has a first part facing the first end of the chassis body and a second part facing the second end of the chassis body, and the first part is capable of sliding out from the first end of the chassis body, and the second part is capable of sliding out from the second end of the chassis body. When the installation frame slides out from the first end of the chassis body (or a first end of the channel), the first part can be exposed outside the chassis body, so that a worker maintains an electronic component installed in the first part. When the installation frame slides out from the second end of the chassis body (or a second end of the channel), the second part can be exposed outside the chassis body, so that the worker maintains an electronic component installed in the second part. A pull-out length of the installation frame can be effectively reduced by using the foregoing arrangement manner. After the installation frame is pulled out, a relatively large torque is not generated for a pulling structure between the installation frame and the chassis body. This helps reduce manufacturing or purchase costs of the pulling structure and improve market competitiveness of the chassis body. In addition, in an actual application, because a pull-out maximum length of the installation frame is effectively shortened, when a plurality of chassis bodies is placed in an application site, for example, an equipment room, in a centralized manner, a distance between the chassis bodies can be effectively shortened. This helps increase space utilization of the application site, for example, the equipment room, and improve an operation space of an operator.

For ease of installation and heat dissipation of the electronic components, a first accommodation space, a fan compartment, and a second accommodation space are disposed in the installation frame, and the first accommodation space, the fan compartment, and the second accommodation space are successively disposed along a direction from the first end of the channel to the second end of the channel. If a heat dissipation fan is installed in the fan compartment, heat of the electronic components in the first accommodation space and the second accommodation space may be dissipated separately. Especially, when some areas of the fan compartment slide out of the chassis body, as long as one air port of the fan compartment is located in the chassis body, the heat dissipation fan may perform heat dissipation on electronic components located in the chassis body. Therefore, a heat dissipation effect of the chassis body is relatively good.

In a technical solution, the first part is the first accommodation space, and the second part is the second accommodation space. In this case, the operator may separately maintain the electronic components that are in the first accommodation space and the second accommodation space at the two ends of the chassis body.

In some implementations, a length of the first accommodation space and a length of the second accommodation space may be diversified. For example, the length of the first accommodation space may be the same as the length of the second accommodation space. Alternatively, the first accommodation space and the second accommodation space may be symmetrically disposed with respect to the fan compartment. In some other implementations, the length of the first accommodation space may alternatively be greater than or less than the length of the second accommodation space. When the first accommodation space and the second accommodation space are symmetrically distributed on two sides of the fan compartment, when the installation frame is pulled out from the chassis body, sizes of parts respectively pulled out from the first end and the second end are relatively close, and are close to half of a length of the entire installation frame along a slide direction. This helps fully reduce a torque generated when the installation frame slides out and force of the pulling structure between the installation frame and the chassis body.

To improve a heat dissipation effect of the chassis, a limiting assembly is further disposed between the installation frame and the chassis body. When the limiting assembly enables the first part or the second part of the installation frame to slide out of the chassis body, it can be ensured that at least one air port of the fan compartment is located in the chassis body. In this case, even if a part of the installation frame slides out of the chassis body, the other part may still be dissipated by the heat dissipation fan, so that the chassis has a relatively good heat dissipation effect, and life spans of the electronic components in the chassis are increased.

When a pulling connection between the installation frame and the chassis body is implemented, the installation frame and the chassis body may be connected by using a guide rail. Because a torque generated after the installation frame slides out of the chassis body is relatively small in the technical solution of this disclosure, the sliding connection may be implemented by using the guide rail. A mechanism of the guide rail is relatively simple, installation and maintenance processes are relatively simple, and costs are relatively low.

In addition, in some implementations, an additional accommodation space may be further disposed in the chassis. For example, in an implementation provided in this disclosure, an auxiliary accommodation space is further disposed. The auxiliary accommodation space is disposed between the installation frame and a bottom plate of the chassis body, to improve layout rationality of a structure in the chassis and increase space utilization in the chassis.

In addition, in a specific implementation, there may be various types of channels. For example, the channel may be a straight channel. To be specific, the installation frame can slide along a straight path in the channel. In addition, the channel may alternatively be an arc channel. To be specific, the installation frame can slide along an arc path in the channel.

According to a second aspect, this disclosure further provides a storage device, including the chassis in any one of the foregoing technical solutions. Hard disks are disposed in the first accommodation space and the second accommodation space that are of the installation frame, and a heat dissipation fan is disposed in the fan compartment. The heat dissipation fan may dissipate heat for the hard disks in the first accommodation space and the second accommodation space, and the first accommodation space is capable of sliding out from the first end of the chassis body, to maintain the hard disks and another component in the first accommodation space. The second accommodation space is capable of sliding out from the second end of the chassis body, to maintain the hard disks and another component in the second accommodation space. In this technical solution, the installation frame is capable of sliding out of the installation frame from the two ends of the chassis body, so that a torque generated after the installation frame slides out is relatively small, and a gravity center offset of the storage device is relatively small. This can improve stability of the storage device. In addition, the installation frame occupies a relatively small channel in the equipment room after sliding out. This improves layout density of storage devices in the equipment room and increases space utilization of the equipment room. In addition, this is convenient for the operator to have a sufficient operation space when maintaining the hard disks in the installation frame.

The chassis is further provided with the auxiliary accommodation space, and the auxiliary accommodation space is disposed between the installation frame and the bottom plate of the chassis body. A circuit board assembly is disposed in the auxiliary accommodation space, and the circuit board assembly may include a control board, a power module, and a baseband processing unit, to improve layout rationality of the structure in the chassis and increase space utilization in the chassis. In addition, cables connecting the circuit board assembly and the hard disks may be located below the installation frame, and are relatively short in length. Therefore, no additional cable management arm needs to be disposed to reduce space occupied by the cables.

The foregoing circuit board assembly is electrically connected to the hard disks through the cables, and the cables are installed on a tank chain coiling mechanism, to protect the cables and prevent the cables from scratching another structure. Further, one end of the foregoing tank chain coiling mechanism is fixedly connected to the installation frame, and the other end of the tank chain coiling mechanism is fixedly connected to the chassis body.

Description of reference signs: 100: storage device; 200: channel; 1: cabinet; 2: chassis; 21: chassis body; 211: first end; 212: second end; 213: second limiting protrusion; 214: auxiliary accommodation space; 2141: circuit board assembly; 215: bottom plate; 22: installation frame; 221: first accommodation space; 222: second accommodation space; 223: fan compartment; 224: first limiting protrusion; 23: guide rail; 24: tank chain coiling mechanism.

DESCRIPTION OF EMBODIMENTS

To make objectives, technical solutions, and advantages of this disclosure clearer, the following further describes this disclosure in detail with reference to accompanying drawings.

To facilitate understanding of a chassis provided in embodiments of this disclosure, the following first describes an application scenario of the chassis.

The chassis provided in the embodiments of this disclosure may be used in a plurality of types of storage devices, and is configured to accommodate, support, or fasten electrical components in the storage devices. Further, a chassis may include hard disks (which may be storage components such as a hard disk drive or a solid-state drive), a circuit board assembly, and a heat dissipation fan. The hard disks, the circuit board assembly, and the heat dissipation fan may be installed in the chassis, and the chassis may protect and support the hard disks, the circuit board assembly, and the heat dissipation fan, to improve security of the storage device. In addition, the hard disks, the circuit board assembly, and the heat dissipation fan may be assembled into the chassis to improve integration of the storage device and form modules, to facilitate installation, arrangement, and other operations on a construction site. In a specific implementation, the hard disk is configured to store data to implement a storage function of the storage device. The circuit board assembly is electrically connected to the hard disks to implement functions such as power supply, data distribution, and data reading for the hard disks. The heat dissipation fan can generate cooling airflow to dissipate heat for the hard disks and the circuit board assembly, so as to ensure normal running of the storage device.

Figure 1:
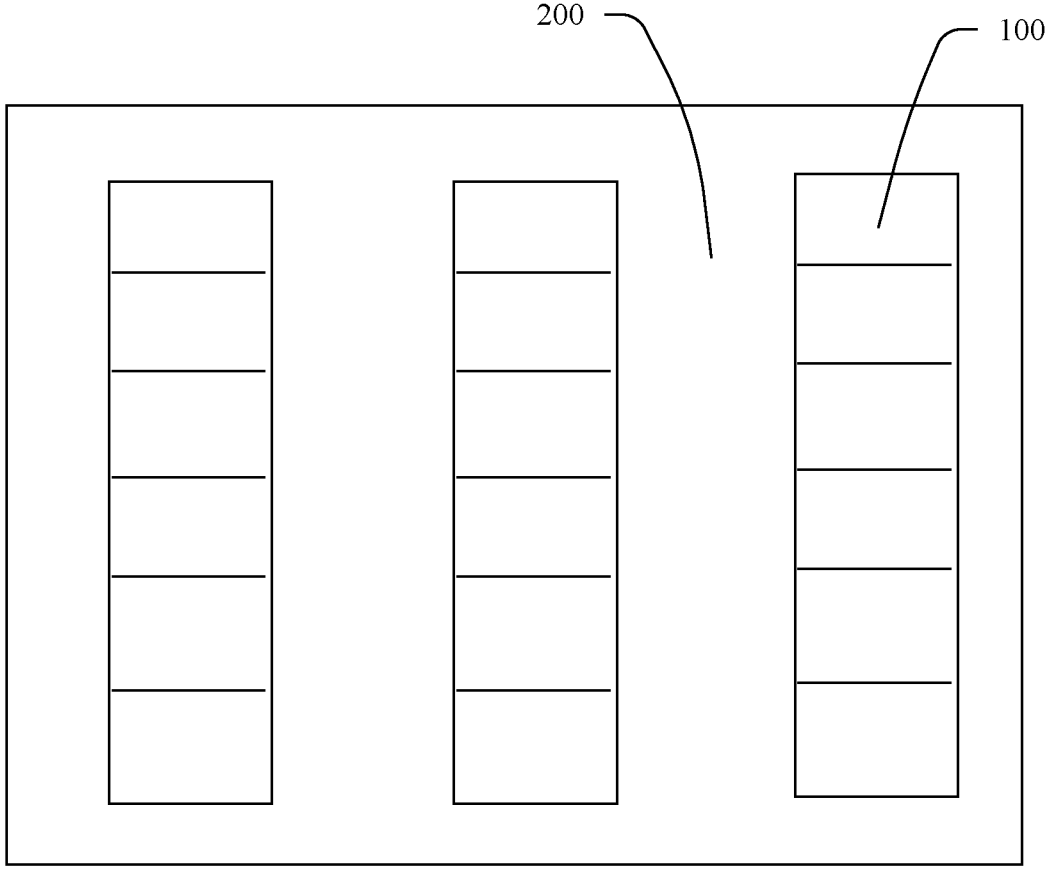
FIG. 1 is a layout diagram of storage devices in an equipment room.

In some implementations of the conventional technology, the chassis may include a chassis body and an installation frame located in the chassis body. The installation frame is fixedly disposed in the chassis body, and the chassis body is drawably installed in the storage device. The hard disks, the circuit board assembly, and the heat dissipation fan may be disposed in the installation frame. When the hard disk needs to be maintained, the entire chassis needs to be pulled out from one side of the storage device for an operation. In a conventional storage device, hard disks may be disposed at a front end (or a pulling end) of a chassis, a circuit board assembly may be disposed at a rear end (an end far away from the pulling end) of the chassis, and a heat dissipation fan may be disposed between the hard disks and the circuit board assembly. Under action of the heat dissipation fan, cooling airflow may enter from a front end of the installation frame and be discharged from a rear end of the installation frame. In actual use, after the chassis body is pulled out from the storage device, a cantilever structure is formed between the chassis body and the storage device. Therefore, if a pull-out length of the installation frame is extremely long or there is a large quantity of hard disks in the installation frame, there is a high risk of toppling when the installation frame is extremely heavy. In addition, after the chassis body is pulled out, a pulling structure (for example, a holding rail) between the chassis body and the storage device bears a large torque, and risks such as bending and deformation are likely to occur. In addition, if a pulling structure with higher stress strength is used, purchase (or manufacturing) costs significantly increase, and market competitiveness of the chassis is reduced. FIG. 1 is a layout diagram of storage devices in an equipment room. Referring to FIG. 1, in an actual application, storage devices 100 are arranged in columns in the equipment room, and a channel 200 may be formed between two columns of storage devices 100, to facilitate worker walking. However, during maintenance, after a chassis body is entirely pulled out from the storage device 100, a pull-out length of the chassis body needs to be not greater than a width of the channel 200. Therefore, a minimum width of the channel 200 usually depends on a maximum pull-out length of an installation frame 22 shown in FIG. 3. This is not conducive to implementing minimum configuration of the channel 200 and increasing space utilization of the equipment room. When the channel 200 is relatively narrow, space is small. This is not conducive to maintaining the chassis body by an operator.

Based on the foregoing problems existing in the conventional storage device, the embodiments of this disclosure provide a chassis and a storage device that can reduce a pull-out length of an installation frame 22.

To clearly understand the technical solutions of this disclosure, the following describes in detail the chassis provided in this disclosure with reference to specific embodiments and the accompanying drawings.

Terms used in the following embodiments are merely intended to describe specific embodiments, but are not intended to limit this disclosure. Terms "one", "a", "the", "the foregoing", "this", and "the one" of singular forms used in this specification and the appended claims of this disclosure are also intended to include plural forms like "one or more", unless otherwise specified in the context clearly. It should be further understood that, in the following embodiments of this disclosure, "at least one" or "one or more" means one, two, or more.

Reference to "an embodiment", "some embodiments", or the like described in this specification indicates that one or more embodiments of this disclosure include a specific feature, structure, or characteristic described with reference to the embodiments. Therefore, in this specification, statements, such as "in an embodiment", "in some embodiments", "in some other embodiments", and "in other embodiments", that appear at different places do not necessarily mean referring to a same embodiment. Instead, the statements mean referring to "one or more but not all of the embodiments", unless otherwise further emphasized in other ways. The terms "include", "comprise", "have", and variants of the terms all mean "include but are not limited to", unless otherwise further emphasized in other ways.

Figure 2:
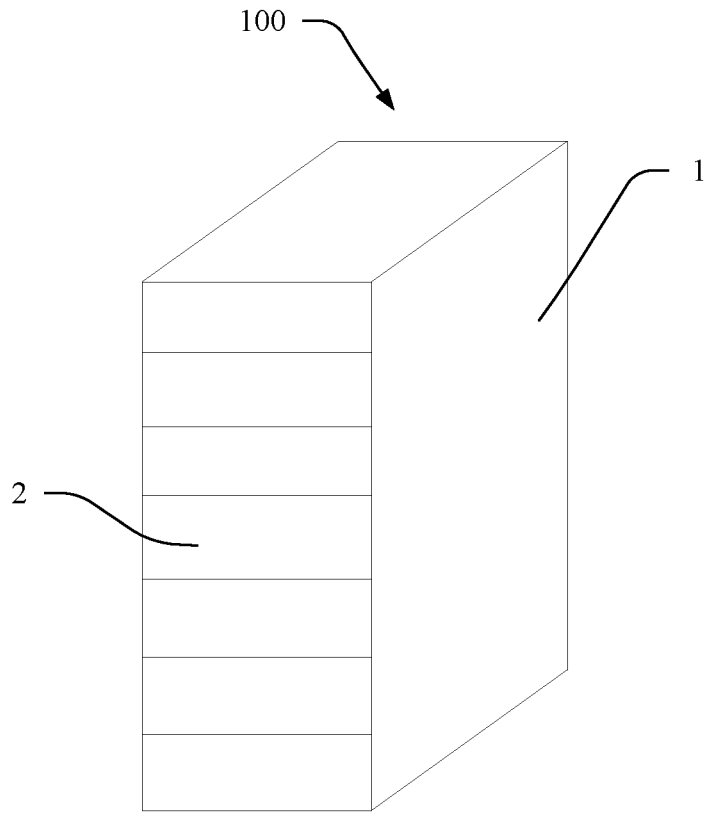
FIG. 2 is a schematic structural diagram of a storage device according to an embodiment of this disclosure.

FIG. 2 is a schematic structural diagram of the storage device 100 according to an embodiment of this disclosure. As shown in FIG. 2, in an embodiment provided in this disclosure, the storage device 100 includes a cabinet 1 and a chassis 2 installed in the cabinet 1, and electronic components are installed in the chassis 2 to implement a function of the storage device 100. In addition, if the chassis 2 is installed in the cabinet 1, the cabinet 1 may provide protection for the chassis 2 and the electronic components in the chassis 2. In another implementation, the storage device 100 may not include the cabinet 1. This is not limited in the present disclosure.

Figure 3:
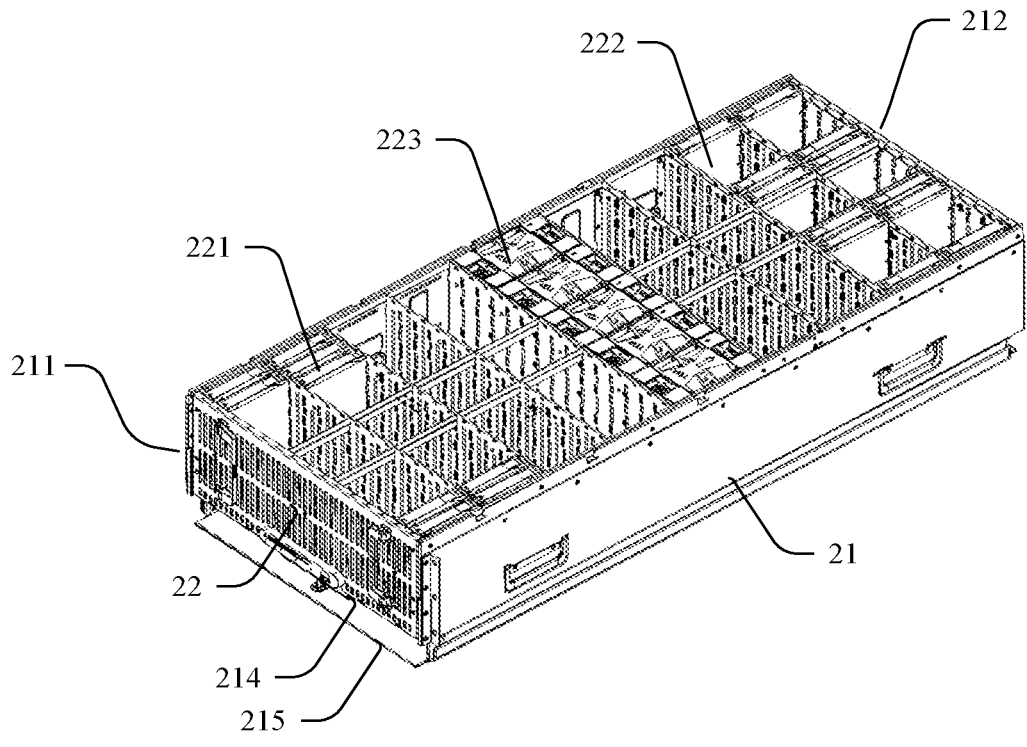
FIG. 3 is a schematic diagram of a partial structure of a chassis of a storage device according to an embodiment of this disclosure.
Figure 4:
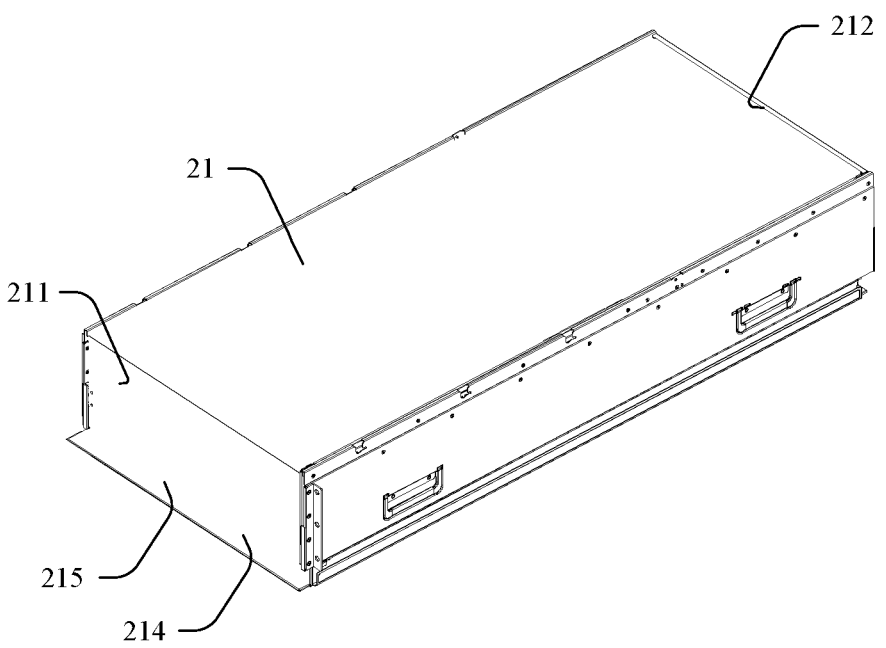
FIG. 4 is a schematic structural diagram of a chassis body according to an embodiment of this disclosure.
Figure 5:
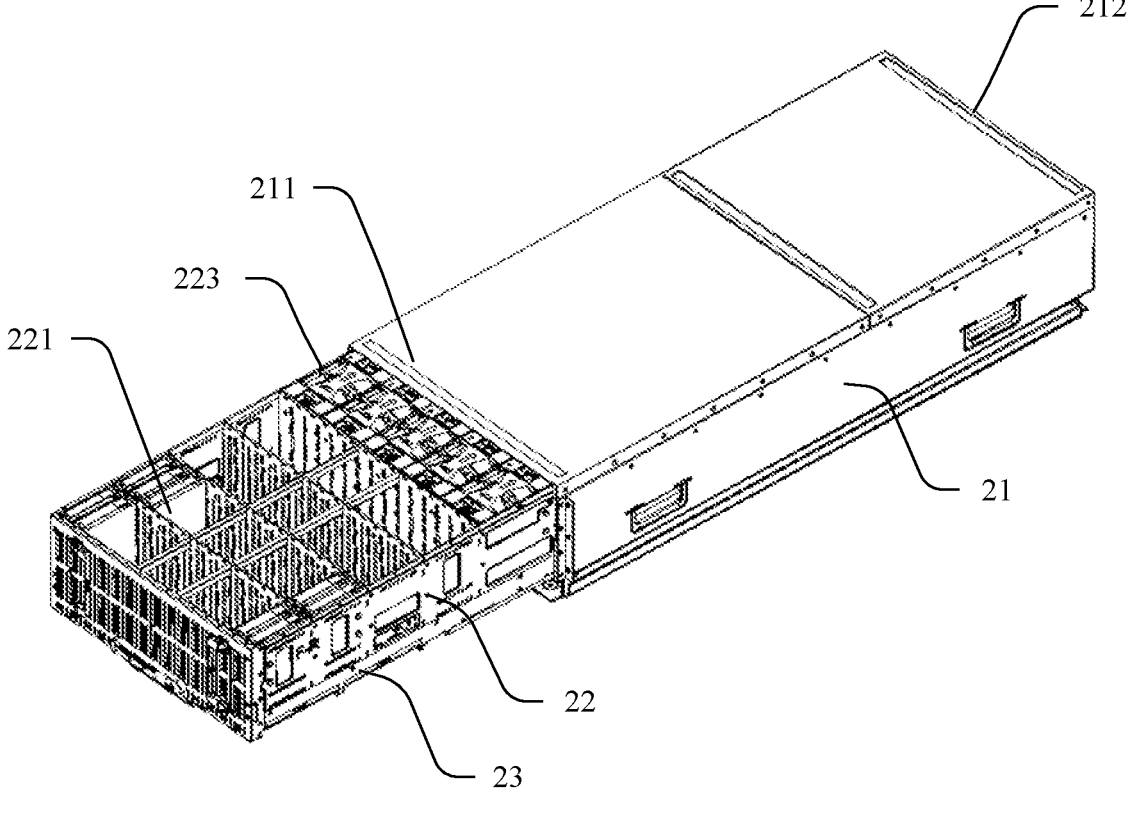
FIG. 5 is a schematic diagram of a status of a chassis according to an embodiment of this disclosure.
Figures 6, 7:
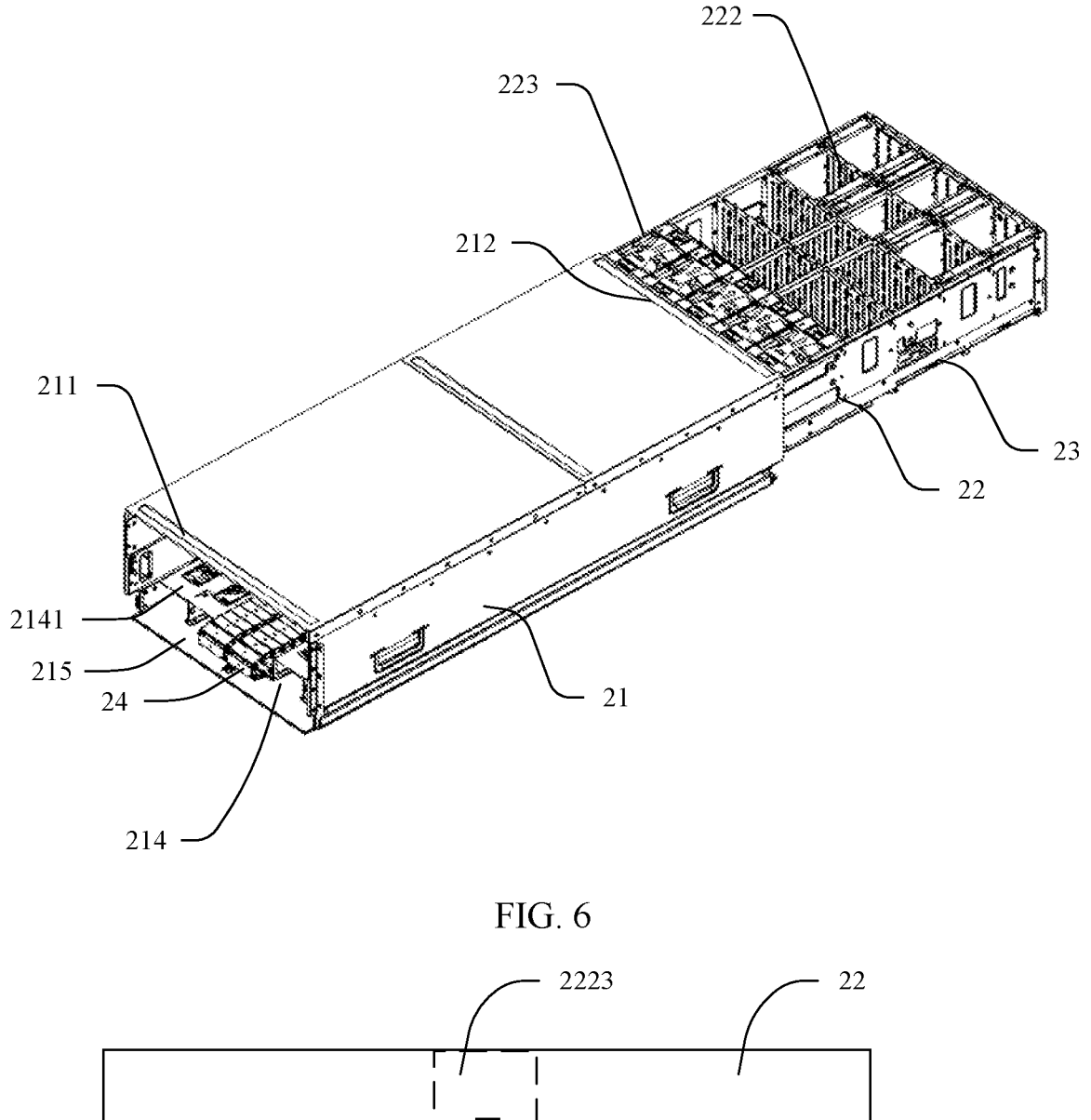
FIG. 6 is a schematic diagram of another status of a chassis according to an embodiment of this disclosure.
FIG. 7 is a schematic structural diagram of an outer wall of an installation frame and an inner wall of a chassis body according to an embodiment of this disclosure.

FIG. 3 is a schematic diagram of a partial structure of the chassis according to an embodiment of this disclosure. As shown in FIG. 3, the chassis 2 includes a chassis body 21 and an installation frame 22 located in the chassis body 21. To describe a structure of the installation frame 22 in the chassis 2, a top cover plate is omitted in the chassis body 21 of the chassis 2 in FIG. 3. It can be seen that the installation frame 22 includes a first accommodation space 221 and a second accommodation space 222. The first accommodation space 221 and the second accommodation space 222 may be used to accommodate hard disks or other electronic components. The installation frame 22 may be disposed in the chassis body 21 in a bi-directional pulling manner. FIG. 4 is a schematic structural diagram of the chassis body according to an embodiment of this disclosure. In a specific embodiment, the chassis body 21 has a channel that passes through a first end 211 and a second end 212 that are of the chassis body 21, and the installation frame 22 is slidably installed in the channel. FIG. 5 is a schematic diagram of a status of the chassis according to an embodiment of this disclosure. FIG. 6 is a schematic diagram of another status of the chassis according to an embodiment of this disclosure. A first part that is of the installation frame 22 and that is close to the first end 211 is capable of sliding out from the first end 211 of the chassis body 21, as shown in FIG. 5. A second part that is of the installation frame 22 and that is close to the second end 212 is capable of sliding out from the second end 212 of the chassis body 21, as shown in FIG. 6. An example in which the chassis 2 is in a used state is used. It is considered that a front end of the chassis body 21 is the first end 211, and a rear end of the chassis body 21 is the second end 212. In this case, the installation frame 22 may pull out the first part from the front end of the chassis body 21, and may pull out the second part from the rear end of the chassis body 21. Therefore, components such as hard disks that are in the first part and the second part of the installation frame 22 may be respectively maintained. A pull-out length of the installation frame 22 can be effectively reduced by using the foregoing arrangement manner. Further, if a length of the first part is L1 and a length of the second part is L2, a total length of the installation frame is L3, where both L1 and L2 are less than L3. If the chassis 2 uses the foregoing bi-directional pulling manner, a pull-out maximum length of the installation frame 22 may be not greater than any one of L1 and L2, and is less than L3. Therefore, after the installation frame 22 is pulled out, a relatively large torque is not generated for a pulling structure between the installation frame 22 and the chassis body 21. This helps reduce manufacturing or purchase costs of the pulling structure and improve market competitiveness of the chassis body 21. In this way, more electronic components can be installed in the installation frame. In addition, in an actual application, because the pull-out maximum length of the installation frame 22 is effectively shortened, when a plurality of chassis bodies 21 are placed in an application site, for example, an equipment room, in a centralized manner, a distance between two chassis bodies 21 that are placed oppositely (for example, front ends or rear ends of the two chassis bodies 21 are placed oppositely) can be effectively shortened. In this way, space utilization of the application site, for example, the equipment room, is increased, and an operation space of an operator is improved. The electronic component in this embodiment of the present disclosure may be hardware, a computing blade, or the like. This is not limited in this embodiment of the present disclosure.

It should be noted that the foregoing length is a length along a direction from the first end 211 of the chassis 2 to the second end 212, namely, a length along a stretching direction of the installation frame 22. Orientation words such as "front", "rear", "left", "right", and "bottom" that appear in the embodiments of this disclosure are merely used to describe a relative relationship between directions by using an example in which the chassis 2 and the storage device each are in one used state.

Still referring to FIG. 3, in an embodiment provided in this disclosure, the installation frame 22 may further include the first accommodation space 221, a fan compartment 223, and the second accommodation space 222. The first accommodation space 221, the fan compartment 223, and the second accommodation space 222 are successively disposed along the direction from the first end 211 of the chassis body 21 to the second end 212 of the chassis body 21. The first accommodation space 221 and the second accommodation space 222 each may accommodate the hard disks, and the fan compartment 223 may accommodate a heat dissipation fan (not shown in the figure). When the installation frame 22 is entirely located in the chassis body 21, airflow generated by the heat dissipation fan may enter the chassis body 21 from the front end of the chassis body 21 (or the first accommodation space 221), and be discharged from the rear end of the chassis body 21 (or the second accommodation space 222). Alternatively, the airflow generated by the heat dissipation fan may enter the rear end of the chassis body 21 (or the second accommodation space 222), and be discharged from the front end of the chassis body 21 (or the first accommodation space 221), to dissipate heat for the components such as the hard disks that are in the first accommodation space 221 and the second accommodation space 222. In this solution, the heat dissipation fan is located between the first accommodation space 221 and the second accommodation space 222. This helps improve a heat dissipation effect of the chassis 2.

In some embodiments, the first part may be the first accommodation space 221, and the second part may be the second accommodation space 222. After the installation frame 22 is pulled out from the front end, the first accommodation space 221 may be exposed outside the chassis body 21, so that a worker can perform work such as maintenance on the components such as the hard disks accommodated in the first accommodation space 221. After the installation frame 22 is pulled out from the rear end of the chassis body 21, the second accommodation space 222 may be exposed outside the chassis body 21, so that the worker can perform work such as maintenance on the components such as the hard disks accommodated in the second accommodation space 222.

In a specific embodiment, not only the first accommodation space 221 or the second accommodation space 222 may slide out of the chassis body 21. For example, the first accommodation space 221 and the fan compartment 223 may slide out of the first end 211 of the chassis body 21 together, and the second accommodation space 222 and the fan compartment 223 may slide out of the second end 212 of the chassis body 21 together. In this case, the first part is the first accommodation space 221 and the fan compartment 223, and the second part is the second accommodation space 222 and the fan compartment 223. Alternatively, a part of the first accommodation space 221 may slide out of the first end 211 of the chassis body 21, and a part of the second accommodation space 222 may slide out of the second end 212 of the chassis body. In this case, the first part is the part of the first accommodation space 221, and the second part is the part of the second accommodation space 222.

In a specific implementation, along the stretching direction of the installation frame 22, a length of the first accommodation space 221 may be the same as or different from a length of the second accommodation space 222. For example, in an embodiment provided in this disclosure, as shown in FIG. 3, along the stretching direction of the installation frame 22, the length of the first accommodation space 221 is the same as or approximately the same as the length of the second accommodation space 222. Further, the first accommodation space 221 and the second accommodation space 222 may be symmetrically disposed with respect to the fan compartment 223, so that stretching lengths of the installation frame 22 from the two ends of the chassis body 21 are relatively close, and a stretching length of the installation frame 22 is controlled to be relatively short.

In some implementations, an accommodation space for accommodating some electronic components may be further disposed between the installation frame 22 and an inner wall of the chassis body 21. For example, in an embodiment provided in this disclosure, an auxiliary accommodation space 214 as shown in FIG. 3 is disposed between the installation frame 22 and the inner wall of the chassis body 21. A storage device is used as an example. In a specific application, a circuit board assembly 2141 as shown in FIG. 6 may be disposed in the auxiliary accommodation space 214. The circuit board assembly 2141 may be fastened on a periphery of the installation frame 22, or may be fastened on the inner wall of the chassis body 21. Alternatively, some components in the circuit board assembly 2141 may be fastened on the periphery of the installation frame 22, and the other components may be fastened on the inner wall of the chassis body 21.

In a specific implementation, a disposition position of the auxiliary accommodation space 214 may be properly selected based on shapes of the chassis body 21 and the installation frame 22, a disposition position of the pulling structure, and the like.

For example, as shown in FIG. 4, in an embodiment provided in this disclosure, the chassis body 21 may be a rectangular housing structure in which front and rear ends are connected, and the installation frame 22 may be a rectangular cube frame structure. A left side of the installation frame 22 is connected to a left side wall of the chassis body 21 by using a pulling structure, and a right side of the installation frame 22 is connected to a right side wall of the chassis body 21 by using a pulling structure. The installation frame 22 may be pulled out from the front end of the chassis body 21, or may be pulled out from the rear end of the chassis body 21. The first accommodation space 221, the fan compartment 223, and the second accommodation space 222 are successively arranged from the front end of the installation frame 22 to the rear end of the installation frame 22. As shown in FIG. 3 and FIG. 4, the auxiliary accommodation space 214 is disposed in a gap between a lower side of the installation frame 22 and a bottom plate 215 of the chassis body 21, so that space utilization of the chassis 2 can be increased, and layout rationality of the chassis 2 can be improved. In some other implementations, shapes of the chassis body 21 and the installation frame are not limited to the foregoing rectangular structures. For example, the chassis body 21 may alternatively be a pillar structure whose cross section is a circle, a triangle, or another polygon. The chassis body 21 may be a cube structure in a spherical shape, a trapezoid shape, or the like. In addition, structures of channels formed in the chassis body 21 may also be diversified. For example, the channel may be a straight channel, or may be an arc channel. This is not limited in this disclosure.

In a specific embodiment, as shown in FIG. 5 and FIG. 6, the foregoing pulling structure may be a guide rail 23. In other words, the installation frame 22 is connected to the chassis body 21 by using the guide rail 23. In the conventional technology, if the entire chassis 2 is pulled out from the storage device, the chassis body 21 is connected to the storage device by using a holding rail, to improve strength of a connection between the chassis body 21 and the storage device. When the entire chassis body 21 is pulled out of the storage device, a relatively good bearing capacity can be provided. In this embodiment of this disclosure, a pulling action is performed only on the installation frame 22, and a pulling stroke is relatively short. Therefore, a requirement for the pulling structure is relatively low. Therefore, in this disclosure, the guide rail 23 is used as a pulling structure. Compared with a structure of the holding rail, the guide rail 23 has a simpler structure, lower costs, and simpler installation and maintenance processes. Certainly, the chassis in the present disclosure does not exclude such a holding rail connection structure.

To improve the heat dissipation effect of the chassis 2 and prevent a misoperation of the operator, in a specific embodiment of this disclosure, a limiting assembly located between the installation frame 22 and the chassis body 21 is further included. When the installation frame 22 is pulled to the front end of the chassis 2, the first part slides out of the chassis body 21, and the limiting assembly enables at least one air port of the fan compartment 223 to be located in the chassis body 21, as shown in FIG. 5. When the installation frame 22 is pulled to the rear end of the chassis 2, the second part slides out of the chassis body 21, and the limiting assembly enables at least one air port of the fan compartment 223 to be located in the chassis body 21, as shown in FIG. 6. In this solution, the limiting assembly enables the at least one air port of the installation frame 22 to be located in the chassis body 21 when the installation frame 22 is pulled out, so that a heat dissipation effect of a component in the chassis body 2 can be ensured, to avoid a case in which the component in the chassis body 2 is overheated. In addition, when the limiting assembly enables the installation frame 22 to be pulled out, the installation frame 22 does not excessively extend from one side, thereby preventing a center of gravity of the storage device from deviating and avoiding a risk of toppling. This can prevent the operator from the misoperation.

In another implementation, optionally, the first accommodation space 221 may slide out from one end of the chassis 2, and the fan compartment 223 is still located in the chassis 2 after the first accommodation space 221 slides out from the chassis 2. The second accommodation space 222 may slide out from the second end 212 of the chassis 2, and the fan compartment 223 is still located in the chassis 2 after the second accommodation space 222 slides out from the chassis 2. This ensures heat dissipation of the chassis.

In a specific embodiment, a specific structure of the limiting assembly is not limited. The following uses an example for description. FIG. 7 is a schematic structural diagram of an outer wall of the installation frame 22 and the inner wall of the chassis body 21 according to an embodiment of this disclosure. Referring to FIG. 7, the limiting assembly includes a first limiting protrusion 224 located on a side wall of the installation frame 22, and two second limiting protrusions 213 located on the inner wall of the chassis body 21. The two second limiting protrusions 213 are respectively located at the two ends of the chassis body 21 and are close to openings, and the first limiting protrusion 224 is opposite to the fan compartment 223. When the first limiting protrusion 224 adapts to the second limiting protrusion 213, and the first limiting protrusion 224 abuts against the second limiting protrusion 213, the installation frame 22 cannot continue to be pulled, and the at least one air port of the fan compartment 2223 is located in the chassis body 21. Alternatively, in other embodiments, another limiting structure may be used. In addition, the limiting structure may be alternatively installed on the guide rail 23. An installation position of the limiting structure is not limited in this disclosure either.

Figure 8:
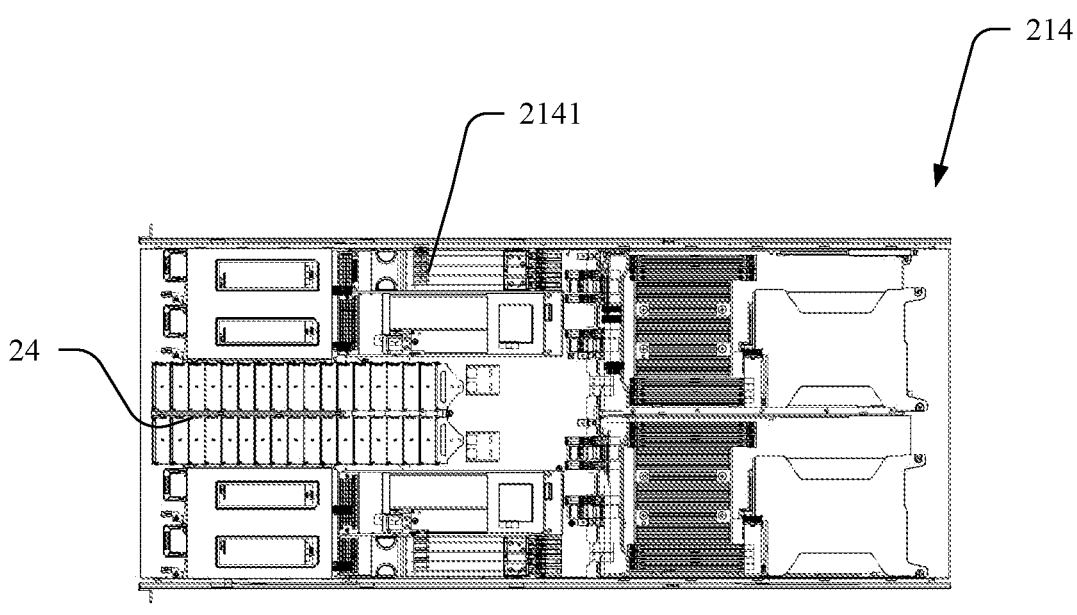
FIG. 8 is a schematic structural diagram of an auxiliary accommodation space according to an embodiment of this disclosure.
Figure 9:
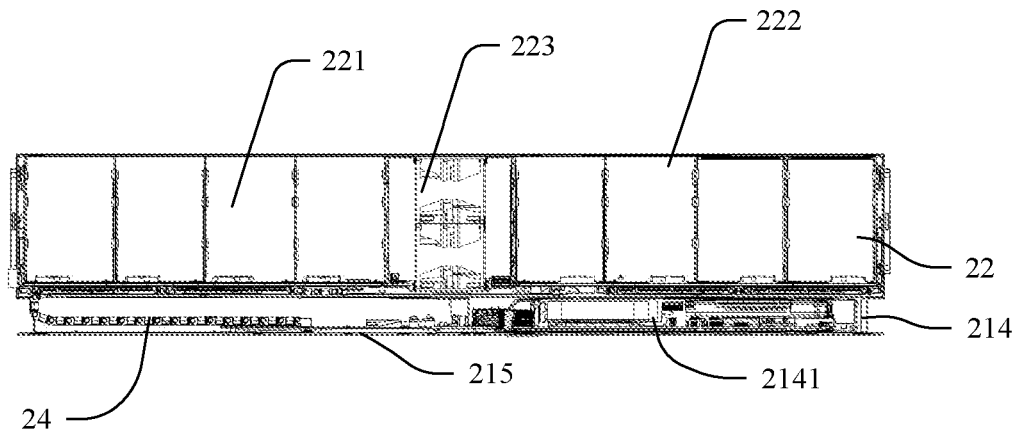
FIG. 9 is a side sectional view of a chassis according to an embodiment of this disclosure.
Figure 10:
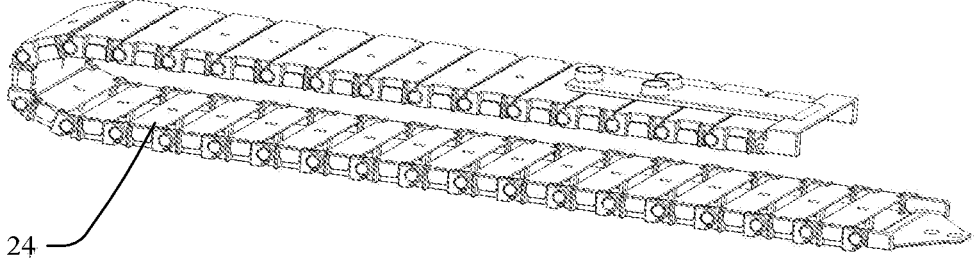
FIG. 10 is a schematic structural diagram of a tank chain coiling mechanism according to an embodiment of this disclosure.

FIG. 8 is a schematic structural diagram of the auxiliary accommodation space 214 according to an embodiment of this disclosure. Referring to FIG. 3, FIG. 4, and FIG. 8, in some embodiments, the auxiliary accommodation space 214 of the chassis 2 is disposed in the gap between the lower side of the installation frame 22 and the bottom plate 215 of the chassis body 21. The circuit board assembly 2141 may be disposed in the auxiliary accommodation space 214, and the circuit board assembly 2141 is fixedly disposed in the chassis 2. To complete work of hard disks in the installation frame 22, the hard disks need to be electrically connected to the circuit board assembly 2141. Cables between the hard disks and the circuit board assembly 2141 is installed on a tank chain coiling mechanism 24. FIG. 9 is a side sectional view of the chassis 2 according to an embodiment of this disclosure. As shown in FIG. 9, one end of the tank chain coiling mechanism 24 is fastened to the chassis 2, and the other end of the tank chain coiling mechanism 24 is fastened to the installation frame 22. As the installation frame 22 moves, the tank chain coiling mechanism 24 drives the cables to move. In this solution, the tank chain coiling mechanism 24 may protect the cables from damage, and may prevent the cables from sleeving a component of the circuit board assembly 2141, to prevent from damaging the circuit board assembly 2141. Therefore, the circuit board assembly 2141 may also be protected. For a structure of the tank chain coiling mechanism 24, refer to FIG. 10. FIG. 10 is a schematic structural diagram of the tank chain coiling mechanism 24 according to an embodiment of this disclosure.

In the conventional technology, the installation frame 22 is entirely pulled out from the front end of the chassis 2, the cables between the hard disks and the circuit board assembly 2141 are long, and the cables are entirely piled up to the rear end of the chassis 2 by using a cable management arm. This not only occupies much space, but also blocks the rear end of the installation frame 22. In addition, a quantity of deployed cables is limited. According to the technical solutions of this disclosure, the cables are located below the installation frame 22, and as the pulling stroke of the installation frame 22 decreases, a length of the cable also decreases accordingly, so that a relatively large quantity of connected cables can be supported. This helps improve an integration level of components.

The following describes the technical solutions of this disclosure by using a specific embodiment. FIG. 3 is a schematic structural diagram of the chassis 2 of a storage device. The chassis 2 includes the chassis body 21 and the installation frame 22. The installation frame 22 includes the first accommodation space 221, the fan compartment 223, and the second accommodation space 222 that are successively disposed along the direction from the first end 211 of the chassis body 21 to the second end 212 of the chassis body 21. Optionally, the first accommodation space 221 and the second accommodation space 222 are symmetrically disposed with respect to the fan compartment 223. A plurality of hard disks are disposed in the first accommodation space 221, a plurality of hard disks are disposed in the second accommodation space 222, and a heat dissipation fan (not shown in the figure) is disposed in the fan compartment 223. Referring to FIG. 5 and FIG. 6, the first accommodation space 221 may slide out from the first end 211 of the chassis 2, and the at least one air port of the fan compartment 223 is located in the chassis 2 after sliding out. The second accommodation space 222 may slide out from the second end 212 of the chassis 2, and the at least one air port of the fan compartment 223 is located in the chassis 2 after sliding out. Optionally, the first accommodation space 221 may slide out from the first end 211 of the chassis 2, and the fan compartment 223 is at least located in the chassis 2 after sliding out. The second accommodation space 222 may slide out from the second end 212 of the chassis 2, and the fan compartment 223 is located in the chassis 2 after sliding out. Further, the first accommodation space 221 and the second accommodation space 222 each may have four rows of hard disk installation areas, and each hard disk installation area may accommodate 15 hard disks. However, in an actual application, a quantity of hard disks to be installed and specific installation locations may be selected based on a requirement. The hard disks may be disposed relatively evenly in the first accommodation space 221 and the second accommodation space 222, to improve stability of the chassis 2. Further, referring to FIG. 3 and FIG. 8, the auxiliary accommodation space 214 is provided between the installation frame 22 of the chassis 2 and the bottom plate 215 of the chassis body 21. A circuit board assembly 2141 is disposed in the auxiliary accommodation space 214, and the circuit board assembly 2141 is fastened on the bottom plate 215 of the chassis body 21. The tank chain coiling mechanism 24 is fixedly installed between the bottom plate of the chassis body 21 and the installation frame 22, the one end of the tank chain coiling mechanism 24 is fastened on the bottom plate 215 of the chassis body 21, and the other end of the tank chain coiling mechanism 24 is fastened to the installation frame 22. The hard disk is connected to the circuit board assembly 2141 through the cables, and the cables are installed on the tank chain coiling mechanism 24 to protect the cables and electronic components. In an implementation, the circuit board assembly in this embodiment of the present disclosure may include a controller, configured to execute an operation request for the hard disks.

In another embodiment, referring to FIG. 3, FIG. 3 is a schematic structural diagram of the chassis 2 of a computing device. The chassis 2 includes the chassis body 21 and the installation frame 22. The installation frame 22 includes the first accommodation space 221, the fan compartment 223, and the second accommodation space 222 that are successively disposed along the direction from the first end 211 of the chassis body 21 to the second end 212 of the chassis body 21. Optionally, the first accommodation space 221 and the second accommodation space 222 are symmetrically disposed with respect to the fan compartment 223. Computing blades are disposed in the first accommodation space 221, computing blades are disposed in the second accommodation space 222, and a heat dissipation fan (not shown in the figure) is disposed in the fan compartment 223. Optionally, referring to FIG. 5 and FIG. 6, the first accommodation space 221 may slide out from the first end 211 of the chassis 2, and the at least one air port of the fan compartment 223 is located in the chassis 2 after sliding out. The second accommodation space 222 may slide out from the second end 212 of the chassis 2, and the at least one air port of the fan compartment 223 is located in the chassis 2 after sliding out. Optionally, the first accommodation space 221 may slide out from the first end 211 of the chassis 2, and the fan compartment 223 is at least located in the chassis 2 after sliding out. The second accommodation space 222 may slide out from the second end 212 of the chassis 2, and the fan compartment 223 is located in the chassis 2 after sliding out. Further, the first accommodation space 221 and the second accommodation space 222 each may have four rows of computing blade installation areas, and each computing blade installation area may accommodate 15 computing blades. However, in an actual application, a quantity of computing blades to be installed and specific installation locations may be selected based on a requirement. The computing blades may be disposed relatively evenly in the first accommodation space 221 and the second accommodation space 222, to improve stability of the chassis 2. Referring to FIG. 3 and FIG. 8, the auxiliary accommodation space 214 is provided between the installation frame 22 of the chassis 2 and the bottom plate 215 of the chassis body 21. A circuit board assembly 2141 is disposed in the auxiliary accommodation space 214, and the circuit board assembly 2141 is fastened on the bottom plate 215 of the chassis body 21. The tank chain coiling mechanism 24 is fixedly installed between the bottom plate of the chassis body 21 and the installation frame 22, the one end of the tank chain coiling mechanism 24 is fastened on the bottom plate 215 of the chassis body 21, and the other end of the tank chain coiling mechanism 24 is fastened to the installation frame 22. The computing blades are connected to the circuit board assembly 2141 through the cables, and the cables are installed on the tank chain coiling mechanism 24 to protect the cables and electronic components.

In another embodiment, referring to FIG. 3, FIG. 3 is a schematic structural diagram of the chassis 2 of a computing device. The chassis 2 includes the chassis body 21 and the installation frame 22. The installation frame 22 includes the first accommodation space 221, the fan compartment 223, and the second accommodation space 222 that are successively disposed along the direction from the first end 211 of the chassis body 21 to the second end 212 of the chassis body 21. Optionally, the first accommodation space 221 and the second accommodation space 222 are symmetrically disposed with respect to the fan compartment 223. Hard disks are disposed in one of the first accommodation space 221 and the second accommodation space 222. Computing blades are disposed in the other accommodation space, and a heat dissipation fan (not shown in the figure) is disposed in the fan compartment 223. Optionally, referring to FIG. 5 and FIG. 6, the first accommodation space 221 may slide out from the first end 211 of the chassis 2, and the at least one air port of the fan compartment 223 is located in the chassis 2 after sliding out. The second accommodation space 222 may slide out from the second end 212 of the chassis 2, and the at least one air port of the fan compartment 223 is located in the chassis 2 after sliding out. Optionally, the first accommodation space 221 may slide out from the first end 211 of the chassis 2, and the fan compartment 223 is at least located in the chassis 2 after sliding out. The second accommodation space 222 may slide out from the second end 212 of the chassis 2, and the fan compartment 223 is located in the chassis 2 after sliding out. Optionally, the hard disks and the computing blades may be evenly disposed in corresponding accommodation spaces, to improve stability of the chassis 2. Referring to FIG. 3 and FIG. 8, the auxiliary accommodation space 214 is provided between the installation frame 22 of the chassis 2 and the bottom plate 215 of the chassis body 21. A circuit board assembly 2141 is disposed in the auxiliary accommodation space 214, and the circuit board assembly 2141 is fastened on the bottom plate 215 of the chassis body 21. The tank chain coiling mechanism 24 is fixedly installed between the bottom plate of the chassis body 21 and the installation frame 22, the one end of the tank chain coiling mechanism 24 is fastened on the bottom plate 215 of the chassis body 21, and the other end of the tank chain coiling mechanism 24 is fastened to the installation frame 22. The hard disks and/or the computing blades are connected to the circuit board assembly 2141 through the cables, and the cables are installed on the tank chain coiling mechanism 24 to protect the cables and electronic components.

The computing blade in this embodiment of the present disclosure may alternatively be a processor. This is not limited in this embodiment of the present disclosure. In addition, the front end and the rear end in the embodiments of the present disclosure are used as relative concepts, and are not limited to being used as the front end and the rear end in actual product use, but represent the two ends of the channel that passes through the chassis.

What is claimed is:

1. A chassis comprising:
a chassis body comprising:
    a first end;
    a second end;
    a channel passing through the first end and the second end;
    a bottom plate; and
    an auxiliary accommodation space;
an installation frame slidably disposed in the channel and comprising:
    a first part capable of sliding out from the first end;
    a second part capable of sliding out from the second end; and
    a fan compartment, wherein the fan compartment comprises an air port configured to be located in the chassis body when the first part or the second part slides out of the chassis body, and wherein the auxiliary accommodation space is a fixed gap located between the installation frame and the bottom plate and is configured to accommodate a circuit board assembly; and
a limiting assembly disposed between the installation frame and the chassis body and configured to prevent the installation frame from sliding out of the chassis body.

2. The chassis of claim 1, wherein the installation frame further comprises:
    a first accommodation space; and
    a second accommodation space, wherein the first accommodation space, the fan compartment, and the second accommodation space are successively arranged along a direction from the first end to the second end.

3. The chassis of claim 2, wherein the first part comprises the first accommodation space, and wherein the second part comprises the second accommodation space.

4. The chassis of claim 2, wherein the first accommodation space and the second accommodation space are symmetrically disposed on two sides of the fan compartment.

5. The chassis of claim 2, wherein the first accommodation space and the second accommodation space comprise computing blades.

6. The chassis of claim 2, wherein the fan compartment comprises a heat dissipation fan.

7. The chassis of claim 1, wherein the installation frame is coupled to the chassis body using a guide rail.

8. The chassis of claim 1, wherein the channel is a straight channel or an arc channel.

9. The chassis of claim 1, wherein the auxiliary accommodation space is selected based on a shape of the chassis body or a shape of the installation frame.

10. A storage device comprising:
a chassis comprising:
    a chassis body comprising:
        a first end;
        a second end;
        a channel passing through the first end and the second end;
        a bottom plate; and
        an auxiliary accommodation space;
    an installation frame slidably disposed in the channel and comprising:
        a first part capable of sliding out from the first end;
        a second part capable of sliding out from the second end; and
        a fan compartment, wherein the fan compartment comprises an air port configured to be located in the chassis body when the first part or the second part slides out of the chassis body, and wherein the auxiliary accommodation space is a fixed gap located between the installation frame and the bottom plate and is configured to accommodate a circuit board assembly; and
a limiting assembly disposed between the installation frame and the chassis body and configured to prevent the installation frame from sliding out of the chassis body;
a plurality of hard disks installed in the first part and the second part; and
a heat dissipation fan installed in the installation frame.

11. The storage device of claim 10, wherein the installation frame further comprises:

a first accommodation space; and a second accommodation space, wherein the first accommodation space, the fan compartment, and the second accommodation space are successively arranged along a direction from the first end to the second end.

12. The storage device of claim 11, wherein the first part comprises the first accommodation space, and wherein the second part comprises the second accommodation space, wherein the hard disks are further installed in the first accommodation space and the second accommodation space, and wherein the heat dissipation fan is further installed in the fan compartment.

13. The storage device of claim 11, wherein the first accommodation space and the second accommodation space are symmetrically disposed on two sides of the fan compartment.

14. The storage device of claim 11, wherein the first accommodation space and the second accommodation space comprise computing blades.

15. The storage device of claim 10, wherein the installation frame is coupled to the chassis body using a guide rail.

16. The storage device of claim 10, wherein the channel is a straight channel.

17. The storage device of claim 10, wherein a position of the auxiliary accommodation space is based on a shape of the chassis body or the installation frame.

18. The storage device of claim 10, wherein the channel is an arc channel.

19. The storage device of claim 10, further comprising a pulling structure configured to allow the installation frame to slide relative to the chassis body, wherein the auxiliary accommodation space is selected based on a disposition position of the pulling structure.

20. The storage device of claim 19, further comprising:

a tank chain coiling mechanism comprising:

a third end fixedly coupled to the installation frame; and a fourth end fixedly coupled to the chassis body; and a plurality of cables installed on the tank chain coiling mechanism, wherein the hard disks are electrically coupled to the circuit board assembly through the cables.

* * * * *